United States Patent
Ikeda et al.

(10) Patent No.: US 10,921,791 B2
(45) Date of Patent: Feb. 16, 2021

(54) PRODUCTION PLAN GENERATION DEVICE, PRODUCTION PLAN GENERATION METHOD, AND PRODUCTION PLAN

(71) Applicant: FUJITSU LIMITED, Kawasaki (JP)

(72) Inventors: Hiroshi Ikeda, Kawasaki (JP); Masakazu Ishizuka, Oyama (JP)

(73) Assignee: FUJITSU LIMITED, Kawasaki (JP)

( * ) Notice: Subject to any disclaimer, the term of this patent is extended or adjusted under 35 U.S.C. 154(b) by 233 days.

(21) Appl. No.: 16/163,488

(22) Filed: Oct. 17, 2018

(65) Prior Publication Data
US 2019/0049935 A1    Feb. 14, 2019

Related U.S. Application Data

(63) Continuation of application No. PCT/JP2016/063057, filed on Apr. 26, 2016.

(51) Int. Cl.
*G05B 19/418*    (2006.01)
*H05K 13/00*    (2006.01)
*H05K 13/08*    (2006.01)

(52) U.S. Cl.
CPC .  *G05B 19/41865* (2013.01); *G05B 19/41805* (2013.01); *G05B 19/41815* (2013.01); *H05K 13/00* (2013.01); *H05K 13/085* (2018.08)

(58) Field of Classification Search
None
See application file for complete search history.

(56) References Cited

U.S. PATENT DOCUMENTS 5,258,915 A * 11/1993 Billington .............. G06Q 10/04
700/103
5,822,210 A   10/1998 Kobayashi et al.
(Continued)

FOREIGN PATENT DOCUMENTS

DE   102009013353 B3   10/2010
DE   102011076565 A1   11/2012
(Continued)

OTHER PUBLICATIONS

EESR—Extended European Search Report dated Apr. 10, 2019 for corresponding European Patent Application No. 16900385.2.
(Continued)

*Primary Examiner* — Santosh R Poudel
(74) *Attorney, Agent, or Firm* — Fujitsu Patent Center

(57) ABSTRACT

An apparatus includes a processor to formulate component-allocation indicating each type of the products, any of the mounters, surface-mounting components, and the number of surface-mounting components to be mounted on a printing-board from the mounter, and optimize the component-allocation using a plan-problem solver; use results of the process by the processor to execute a process of grouping the types of products to be produced without switching surface-mounting component supply carriages set for the plurality of mounters; formulate the order of the production groups of the products after the grouping, solve the integer-plan problem using an integer-plan-problem solver, and execute, for each of the variations, a process of optimizing the production-order so that a time period for producing all the products is minimized; and determine a production-plan that is among results, obtained by the processor, of the process of optimizing the production order and causes a shortest-production time period.

5 Claims, 13 Drawing Sheets

(56) References Cited

U.S. PATENT DOCUMENTS

| | | | |
|---|---|---|---|
| 2006/0052893 A1 | 3/2006 | Yamazaki et al. | |
| 2008/0154392 A1* | 6/2008 | Maenishi | H05K 13/085 700/32 |
| 2012/0004762 A1 | 1/2012 | Bauer et al. | |
| 2015/0160648 A1 | 6/2015 | Craiovan et al. | |
| 2015/0296671 A1* | 10/2015 | Pfaffinger | H05K 13/08 29/830 |
| 2016/0021803 A1* | 1/2016 | Iwata | G06F 30/20 703/6 |
| 2016/0360657 A1* | 12/2016 | Oyama | H05K 13/0434 |
| 2017/0308963 A1* | 10/2017 | Takehara | G06Q 10/063112 |
| 2017/0318716 A1* | 11/2017 | Pfaffinger | G05B 19/4097 |

FOREIGN PATENT DOCUMENTS

| | | | |
|---|---|---|---|
| EP | 2842402 | 3/2015 | |
| EP | 3180969 | 6/2017 | |
| JP | 09-260893 | 10/1997 | |
| JP | 10-034459 | 2/1998 | |
| JP | 2001-251095 | 9/2001 | |
| JP | 2005-159160 | 6/2005 | |
| JP | 2006-515118 | 5/2006 | |
| JP | 2006-253184 | 9/2006 | |
| JP | 2009-010244 | 1/2009 | |
| JP | 2013-191677 | 9/2013 | |
| JP | 2015-146118 | 8/2015 | |
| WO | WO-2015125226 A1 * | 8/2015 | H05K 13/08 |

OTHER PUBLICATIONS

International Search Report mailed in connection with PCT/JP2016/063057 and dated Jul. 26, 2016 (2 pages).

EPOA—Office Action of European Patent Application No. 16900385.2 dated Aug. 24, 2020.  References cited in the EPOA were previously submitted in the IDS filed on Apr. 23, 2019.

* cited by examiner

FIG. 6

<FIGURE NUMBER QUANTITY INFORMATION DB 52>

| FIGURE NUMBER | NUMBER OF BOARDS |
|---|---|
| FIGURE NUMBER a | 50 |
| FIGURE NUMBER b | 100 |
| FIGURE NUMBER c | 20 |
| FIGURE NUMBER d | 40 |
| FIGURE NUMBER e | 150 |
| FIGURE NUMBER f | 300 |
| ⋮ | ⋮ |

FIG. 7A

<PRODUCTION INFORMATION DB 54>

(MOUNTED COMPONENT INFORMATION TABLE 154A)

| FIGURE NUMBER | COMPONENT | NUMBER OF COMPONENTS TO BE MOUNTED ON SINGLE BOARD |
|---|---|---|
| FIGURE NUMBER a | COMPONENT 1 | 1 |
| FIGURE NUMBER a | COMPONENT 2 | 5 |
| FIGURE NUMBER a | COMPONENT 3 | 20 |
| FIGURE NUMBER a | COMPONENT 4 | 400 |
| FIGURE NUMBER b | COMPONENT 2 | 3 |
| FIGURE NUMBER b | COMPONENT 5 | 6 |
| FIGURE NUMBER b | COMPONENT 6 | 10 |
| ⋮ | ⋮ | ⋮ |

FIG. 7B

<PRODUCTION INFORMATION DB 54>

(MOUNTER INFORMATION TABLE 154B)

| MOUNTER | CARRIAGE POSITION | CAPACITY OF CARRIAGE | FIXED OR INITIAL SETUP |
|---|---|---|---|
| MOUNTER 1 | CARRIAGE POSITION 1 | 50 | INITIAL SETUP CARRIAGE |
| MOUNTER 2 | CARRIAGE POSITION 2_1 | 30 | INITIAL SETUP CARRIAGE |
| MOUNTER 2 | CARRIAGE POSITION 2_2 | 30 | INITIAL SETUP CARRIAGE |
| MOUNTER 3 | CARRIAGE POSITION 3_1 | 50 | FIXED CARRIAGE |
| MOUNTER 3 | CARRIAGE POSITION 3_2 | 30 | FIXED CARRIAGE |
| MOUNTER 4 | CARRIAGE POSITION 4 | 60 | INITIAL SETUP CARRIAGE |
| MOUNTER 5 | CARRIAGE POSITION 5 | 100 | INITIAL SETUP CARRIAGE |
| ⋮ | ⋮ | ⋮ | ⋮ |

FIG. 8

<PRODUCTION INFORMATION DB 54>

(CARRIAGE POSITION INFORMATION TABLE 154C)

| CARRIAGE POSITION | COMPONENT | TIME PERIOD FOR MOUNTING SINGLE COMPONENT | CAPACITY TO BE USED FOR COMPONENT | OFF-LINE SETUP TIME PERIOD FOR COMPONENT | ALLOCATION PENALTY |
|---|---|---|---|---|---|
| CARRIAGE POSITION 1 | COMPONENT 1 | 0.2 | 1 | 90 | 1 |
| CARRIAGE POSITION 1 | COMPONENT 2 | 0.3 | 2 | 50 | 2 |
| CARRIAGE POSITION 1 | COMPONENT 3 | 0.2 | 5 | 70 | 0 |
| CARRIAGE POSITION 1 | COMPONENT 4 | MOUNTING DISABLED | 4 | DISABLED | 0 |
| CARRIAGE POSITION 2_1 | COMPONENT 1 | 0.2 | 2 | 90 | 0 |
| CARRIAGE POSITION 2_1 | COMPONENT 2 | 0.3 | 3 | 50 | 0 |
| CARRIAGE POSITION 2_1 | COMPONENT 3 | 0.2 | 5 | 70 | 3 |
| CARRIAGE POSITION 2_1 | COMPONENT 4 | 0.4 | 5 | 100 | 0 |
| CARRIAGE POSITION 3_1 | COMPONENT 1 | 0.2 | FIXED CARRIAGE | FIXED CARRIAGE | 0 |
| CARRIAGE POSITION 3_1 | COMPONENT 2 | 0.2 | FIXED CARRIAGE | FIXED CARRIAGE | 0 |
| ... | ... | ... | ... | ... | ... |

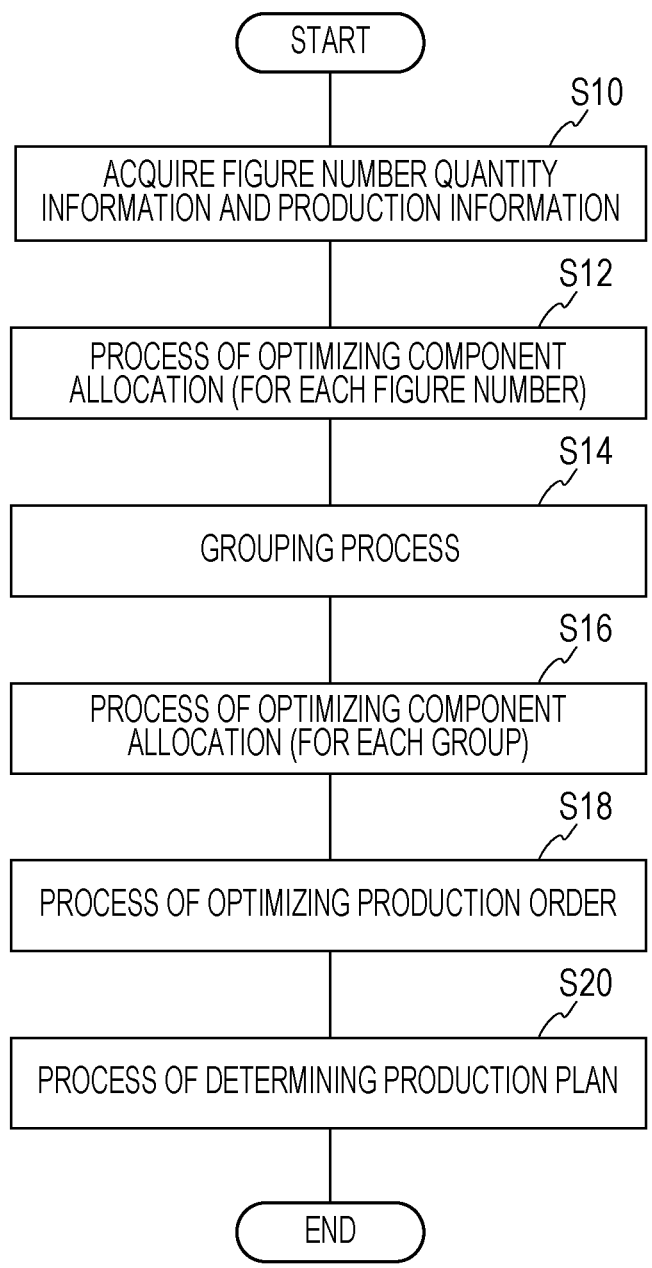

FIG. 11

<PRODUCTION PLAN INFORMATION>

(FIGURE NUMBER GROUP PRODUCTION ORDER INFORMATION)

| PRODUCTION ORDER | FIGURE NUMBER GROUP |
|---|---|
| 1 | GROUP A |
| 2 | GROUP C |
| 3 | GROUP B |
| ⋮ | ⋮ |

(FIGURE NUMBER GROUP INFORMATION)

| FIGURE NUMBER GROUP | FIGURE NUMBER |
|---|---|
| GROUP A | FIGURE NUMBER a |
| GROUP A | FIGURE NUMBER d |
| GROUP A | FIGURE NUMBER f |
| GROUP B | FIGURE NUMBER c |
| GROUP B | FIGURE NUMBER e |
| ⋮ | ⋮ |

(COMPONENT ALLOCATION INFORMATION)

| FIGURE NUMBER | COMPONENT | CARRIAGE POSITION | NUMBER OF COMPONENTS SET AT CARRIAGE POSITION |
|---|---|---|---|
| FIGURE NUMBER a | COMPONENT 1 | CARRIAGE POSITION 1 | 1 |
| FIGURE NUMBER a | COMPONENT 2 | CARRIAGE POSITION 2 | 5 |
| FIGURE NUMBER a | COMPONENT 3 | CARRIAGE POSITION 3_1 | 10 |
| FIGURE NUMBER a | COMPONENT 3 | CARRIAGE POSITION 4 | 10 |
| FIGURE NUMBER a | COMPONENT 4 | CARRIAGE POSITION 2 | 100 |
| FIGURE NUMBER a | COMPONENT 4 | CARRIAGE POSITION 5 | 200 |
| FIGURE NUMBER a | COMPONENT 4 | CARRIAGE POSITION 6 | 100 |
| ⋮ | ⋮ | ⋮ | ⋮ |

PRODUCTION PLAN GENERATION DEVICE, PRODUCTION PLAN GENERATION METHOD, AND PRODUCTION PLAN

CROSS-REFERENCE TO RELATED APPLICATION

This application is a continuation application of International Application PCT/JP2016/063057, filed on Apr. 26, 2016, and designated the U.S., the entire contents of which are incorporated herein by reference.

TECHNICAL FIELD

The present invention relates to a production-plan generating device, a production-plan generation method, and a production-plan generation program.

BACKGROUND

It is desirable that the production of all products (figure numbers) scheduled to be produced be completed early in a production line including a surface mounting line for the cost and the deadline. In production plan generation, an appropriate plan is to be generated based on information of the products scheduled to be produced, information of the production line, and the like.

Traditionally, techniques for improving the efficiency of the production of boards, reducing a time period for work related to the production of the boards, and reducing a workload for an initial setup for the production of the boards are known (refer to, for example, Japanese Laid-open Patent Publication Nos. 2006-253184, 9-260893, 2009-10244, and 2013-191677).

SUMMARY

According to one aspect, a production-plan generating device for generating a production plan for a surface mounting line including a plurality of mounters for mounting surface mounting components on printing boards to produce products, includes a processor configured to: formulate, as an integer plan problem for each of variations for which optimization indices and constraints vary, component allocation indicating, for each of types of the products, any of the mounters, surface mounting components, and the number of surface mounting components to be mounted on a printing board from the mounter, and optimize the component allocation using an integer plan problem solver; use results of the process by the processor to execute, for each of the variations, a process of grouping the types of products to be produced without switching surface mounting component supply carriages set for the plurality of mounters; formulate, as an integer plan problem, the order of the production of groups of the products after the grouping, solve the integer plan problem using an integer plan problem solver, and execute, for each of the variations, a process of optimizing the production order so that a time period for producing all the products is minimized; and determine, as the production plan for the surface mounting line, a production plan that is among results, obtained by the processor, of the process of optimizing the production order and causes the shortest production time period.

The object and advantages of the embodiments will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating an example of a data structure of a figure number quantity information DB.
FIGS. 7A and 7B are diagrams (first diagrams) illustrating an example of a data structure of a production information DB.
FIG. 8 is a diagram (second diagram) illustrating an example of the data structure of the production information DB.
FIG. 10 is a flowchart illustrating a process of determining a production plan by the server.
FIG. 11 is a diagram illustrating production plan information.

DESCRIPTION OF EMBODIMENTS

In the case where a production plan for a production line is to be generated, component allocation, figure number groups, the order in which the figure number groups are produced are to be optimized, a production time period is to be minimized, and a combinatorial optimization problem with variables related to figure numbers scheduled to be produced and a production line is to be solved. The "component allocation" is information defining a mounter among mounters included in a surface mounting line, components to be mounted on a printing board, and the number of components to be mounted on the printing board from the mounter. In addition, the "figure number groups" indicate groups of figure numbers able to be continuously produced without changing components set on the mounters of the surface mounting line.

However, since many variables to be used for the combinatorial optimization problem exist, it may take long time to generate an optimal production plan or combinatorial explosion may occur, and the production plan may not be generated.

According to an aspect, an object of the invention is to provide a production-plan generating device, a production plan generation method, and a production-plan generation program, which reduce a process load to be applied when a production plan for a production line is generated.

Hereinafter, an embodiment of a production system is described in detail with reference to FIGS. 1 to 12.

Figure 1:
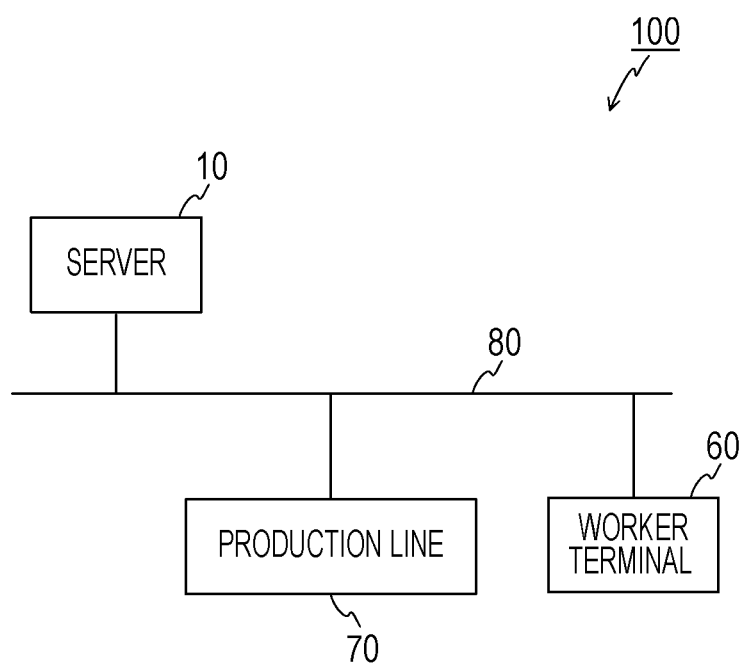
FIG. 1 is a diagram schematically illustrating a configuration of a production system according to an embodiment.

FIG. 1 schematically illustrates a configuration of a production system 100 according to the embodiment. As illustrated in FIG. 1, the production system 100 according to the embodiment includes a production line 70, a server 10 serving as a production-plan generating device, and a worker terminal 60. The production line 70, the server 10, and the worker terminal 60 are connected to a network 80.

Figure 2:
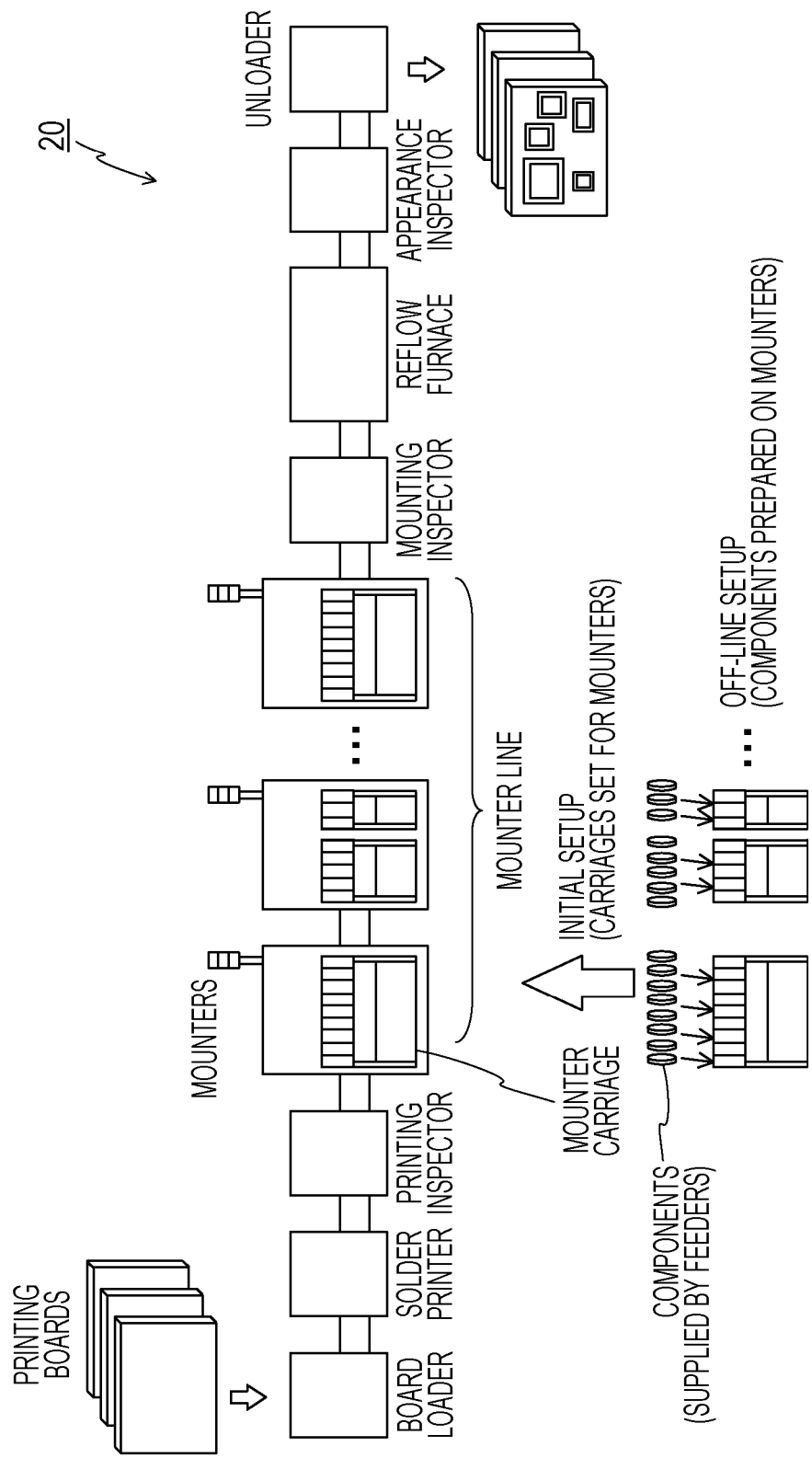
FIG. 2 is a diagram illustrating a surface mounting line.

The production line 70 may include a surface mounting line 20 illustrated in FIG. 2 as an example. The surface mounting line 20 is a line to be used to mount components on printing boards (hereinafter merely referred to as "boards"). The surface mounting line 20 includes a board loader, a solder printer, a printing inspector, a mounter line, a mounting inspector, a reflow furnace, an appearance inspector, an unloader, and the like, which are connected to each other via a conveyor. The mounter line includes mounters for mounting components on boards (surface mounting technology (SMT)).

The board loader loads boards onto the conveyor. The solder printer prints solder at predetermined positions on the boards. The printing inspector inspects the solder on the boards. Boards that have passed the inspection executed by the printing inspector are transported to the mounter line. In the mounter line, the mounters execute surface mounting to mount surface mounting components (hereinafter merely referred to as "components") such as electronic components on the solder printed on the boards. The mounting inspector inspects whether or not the mounting of each of the components on the boards has failed. The reflow furnace fixes the components to the boards by executing reflow on the boards that have passed the inspection.

The appearance inspector inspects whether or not there is a failure in appearances of the boards. The unloader extracts, from the conveyor, the boards that have passed the inspection.

Each surface mounting line 20 (mounter line) processes figure numbers in order determined in advance for a production plan. In this specification, each of the "figure numbers" indicates a combination (lot) of one or more same boards to be continuously produced in the same surface mounting line.

The mounter line has the following facility constraints.

(1) Different types of components to be mounted on boards are prepared on mounter carriages (surface mounting component supply carriages) using component supplying devices (feeders) and are mounted on the boards after the setting of the mounter carriages for the mounters. An operation of preparing a component on a mounter carriage is referred to as "off-line setup".

(2) When different types of components to be mounted on boards by mounters are to be replaced, the components are replaced on a carriage basis. Like the second mounter from the left of FIG. 2, carriages may be set for a single mounter.

Figure 3:
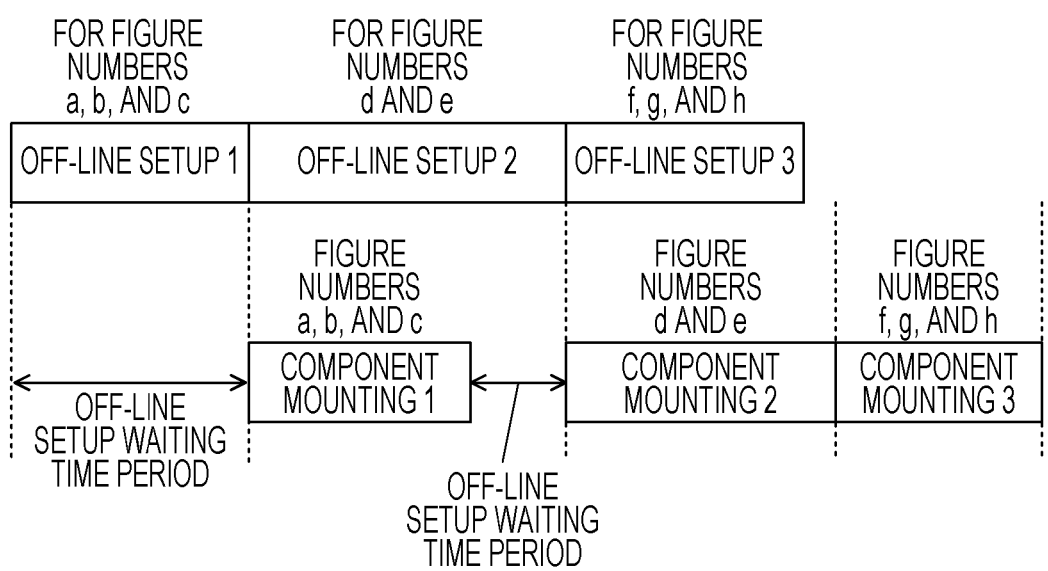
FIG. 3 is a diagram describing an off-line setup waiting time period.

(3) All different types of components to be mounted on the same figure number are to be set on any of the carriages included in the mounter line. Specifically, a carriage set for any of the mounters is not replaced during the time when the production of the same figure number is executed. In addition, when an off-line setup is not terminated before the start of the production of a certain figure number, the production of the certain figure number is not started. A time period for waiting for the start of the production of the figure number until the end of the off-line setup is hereinafter referred to as "off-line setup waiting time period". For example, as illustrated in FIG. 3, during a time period up to the termination of off-line setups for figure numbers a, b, and c, components are not mounted on the figure numbers a, b, and c, and off-line setup waiting time periods occur. In addition, during the time when components are mounted on the figure numbers a, b, and c, off-line setups for the next figure numbers d and e may be executed in parallel. However, during a time period up to the end of the off-line setups for the figure numbers d and e after the termination of the mounting of components on the figure numbers a, b, and c, off-line setup waiting time periods occur, and thereby components are not mounted on the figure numbers d and e.

(4) Different types of components (feeders) to be prepared on a single carriage are limited. The feeders are devices for supplying components to the mounters. Each of the feeders is configured to supply one type of components. The supply of components to the feeders is executed by reels. When there is not any component of a reel, a new reel is set for a feeder.

(5) Off-line setup time periods vary for types of components.

Recently, a small number of products of many types are produced. In the mounter line, all types of components to be used to produce all figure numbers included in a production plan are not set in the mounter line at once, and carriages are to be switched. In this case, time periods (production time periods) for mounting components on the figure numbers in the mounter line vary depending on the allocation (indicating the mounters, carriage positions, components, and the numbers of components to be mounted on printing boards from the carriage positions of the mounters) of components to be mounted on the figure numbers.

Before the start of the production of a certain figure number, components are to be in a state in which the components are able to be mounted on the figure number in the mounter line. However, when all components to be used to produce figure numbers are prepared in the mounter line, a carriage is not switched. In this case, operations of off-line setups are reduced. A combination of figure numbers for which a carriage is not switched is referred to as "figure number group".

In addition, carriages may be fixed to certain mounters and may not be changed during a time period from the start of production to the completion of the production. Thus, components able to be mounted from the certain mounters are limited to components set on carriages at the start time of the production. These mounters and these carriages are referred to as "fixed mounters" and "fixed carriages". Mounters other than the fixed mounters are referred to as "initial setup mounters", and carriages other than the fixed carriages are referred to as "initial setup carriages".

Returning to FIG. 1, the server 10 generates a production plan for the mounter line included in the production line 70 based on predetermined figure number quantity information and production information. In addition, the server 10 transmits the generated production plan to the production line 70 and the worker terminal 60.

Figure 4:
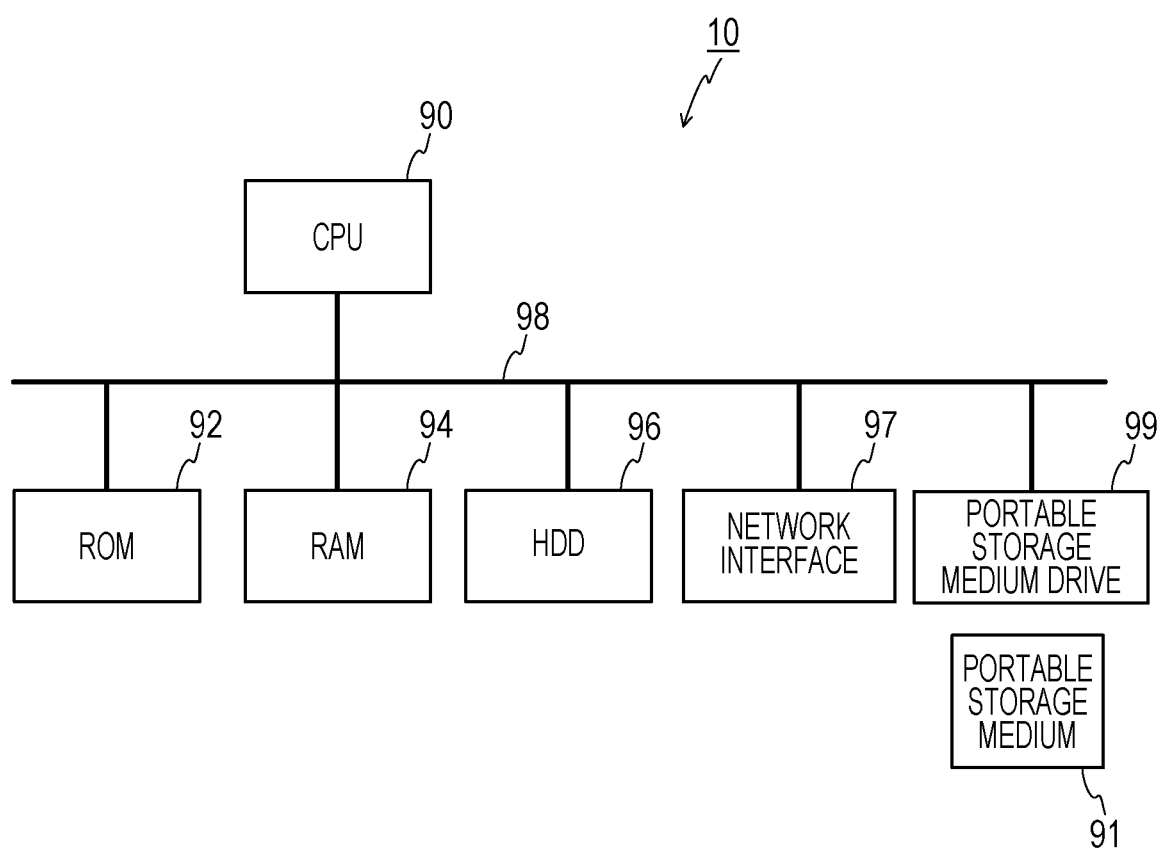
FIG. 4 is a diagram illustrating a hardware configuration of a server.
Figure 5:
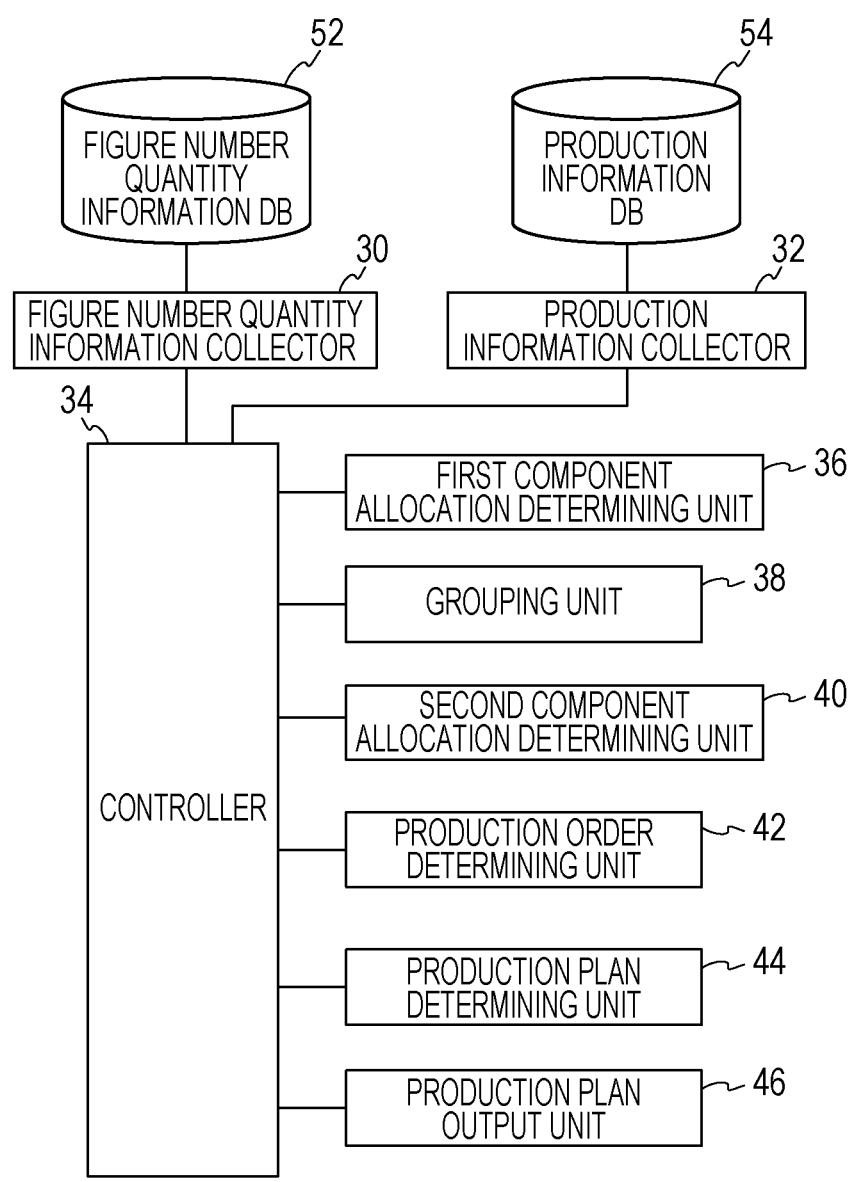
FIG. 5 is a functional block diagram of the server.

FIG. 4 illustrates a hardware configuration of the server 10. As illustrated in FIG. 4, the server 10 includes a central processing unit (CPU) 90, a read only memory (ROM) 92, a random-access memory (RAM) 94, a storage unit (hard disk drive (HDD) in this case) 96, a network interface 97, a portable storage medium drive 99, and the like. The constituent units of the server 10 are connected to a bus 98. In the server 10, functions serving as the units and illustrated in FIG. 5 are enabled by causing the CPU 90 to execute a program (including a production-plan generation program) stored in the ROM 92 or the HDD 96 or read by the portable storage medium drive 99 from the portable storage medium 91. FIG. 5 illustrates a figure number quantity information database (DB) 52 and a production information DB 54, which are stored in the HDD 96 of the server 10 or the like.

FIG. 5 is a functional block diagram of the server 10. The CPU 90 executes the program, thereby functioning as a figure number quantity information collector 30, a production information collector 32, a controller 34, a first component allocation determining unit 36 serving as a first optimizing unit, a grouping unit 38, a second component allocation determining unit 40 serving as a third optimizing unit, a production order determining unit 42 serving as a second optimizing unit, a production plan determining unit 44 serving as a determining unit, and a production plan output unit 46, which are illustrated in FIG. 5.

The figure number quantity information collector 30 collects the figure number quantity information from the figure number quantity information DB 52 and transmits the collected figure number quantity information to the controller 34. The figure number quantity information includes information indicating the number of boards to be produced for each of the figure numbers. FIG. 6 illustrates an example of a data structure of the figure number quantity information DB 52. As illustrated in FIG. 6, the figure number quantity information DB 52 includes fields for "figure numbers" and "the numbers of boards".

Returning to FIG. 5, the production information collector 32 collects the production information from the production information DB 54 and transmits the collected production information to the controller 34. The production information DB 54 includes a mounting component information table 154A illustrated in FIG. 7A, a mounter information table 154B illustrated in FIG. 7B and a carriage position information table 154C illustrated in FIG. 8.

The mounting component information table 154A is a table including information indicating which and how many components are to be mounted on each of boards for each of the figure numbers. As illustrated in FIG. 7A, the mounting component information table 154A includes fields for "figure numbers", "components", and "the numbers of components to be mounted per board". For example, in FIG. 7A, for a figure number a, information indicating that one component 1, five components 2, twenty components 3, and four hundred components 4 are to be mounted on each board or the like is stored.

The mounter information table 154B is a table to be used to manage information of carriages able to be set for each of the mounters. As illustrated in FIG. 7B, the mounter information table 154B includes fields for "mounters", "carriage positions", "the capacities of carriages", and "fixed or initial setup". In FIG. 7B, for example, information indicating that an initial setup carriage (carriage position 1) having a capacity of 50 is able to be set for a mounter 1, information indicating that initial setup carriages (carriage positions 2_1 and 2_2) having a capacity of 30 are able to be set for a mounter 2, and the like are stored. Note that a "carriage position" indicates a position at which a carriage of a mounter is set.

The carriage position information table 154C is a table to be used to manage information of each of the carriage positions. As illustrated in FIG. 8, the carriage position information table 154C includes fields for "carriage positions", "components", "time periods for mounting a single component", "capacities to be used for the components", "off-line setup time periods for the components", and "allocation penalties". In the carriage position information table 154C, information indicating a time period for mounting a single component on a board after the component is prepared at a carriage position or indicating that the component is not able to be mounted, and information indicating a capacity of a carriage to be used for components and an off-line setup time period for the components are stored. In addition, in the "allocation penalties", values indicating penalties when components other than recommended components are allocated to carriages are stored.

Returning to FIG. 5, the controller 34 collectively controls processes to be executed by the functions (units) of the server 10. For example, the controller 34 transmits data collected by the figure number quantity information collector 30 and the production information collector 32 to the units 36 to 46 at appropriate time and causes the units 36 to 46 to execute processes at appropriate time.

Figure 9:
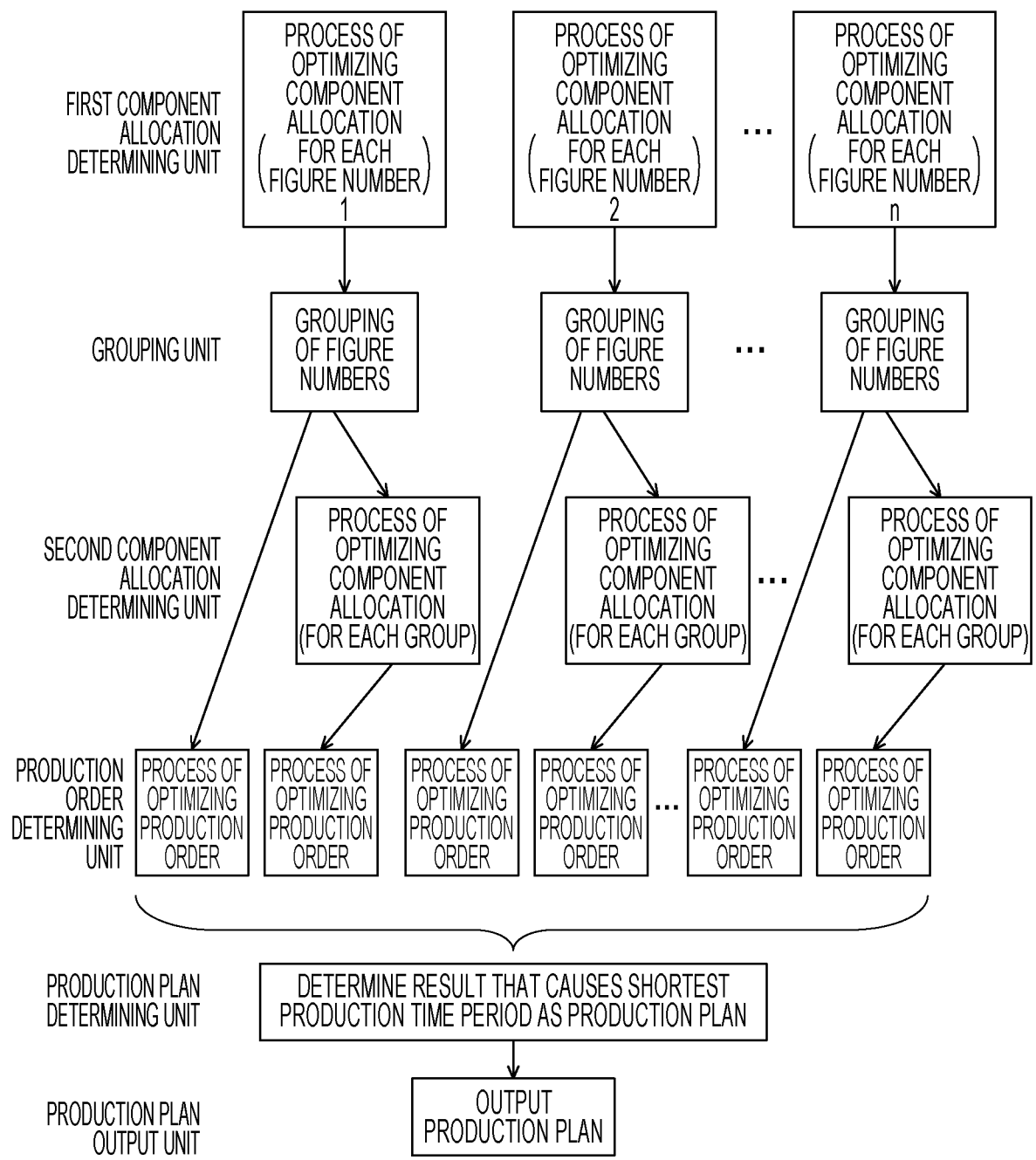
FIG. 9 is a diagram schematically illustrating a process to be executed by the server according to the embodiment.

The first component allocation determining unit 36 executes a process of optimizing component allocation for each figure number. The first component allocation determining unit 36 executes formulation as an integer plan problem for each of variations for which optimization indices and constraints vary. The first component allocation determining unit 36 uses an integer plan problem solver such as a GNU linear programming kit (GLPK) to execute the process of optimizing the component allocation for each figure number. FIG. 9 schematically illustrates an overview of the processes to be executed by the units 36 to 46. For example, when a number n of types of variations exist, the first component allocation determining unit 36 executes the process of optimizing the component allocation for the number of figure numbers for the number n of types of variations. Details of the variations and details of the optimization process are described later.

The grouping unit 38 groups the figure numbers based on the component allocation of the figure numbers that has been determined for each of the variations as a result of the process executed by the first component allocation determining unit 36. The grouping of the figure numbers indicates that combinations of the figure numbers to be produced without changing components able to be supplied from the mounter line (without executing off-line setup) are grouped.

The second component allocation determining unit 40 re-executes the process of optimizing the component allocation for each of the figure number groups grouped as a result of the process executed by the grouping unit 38.

The production order determining unit 42 optimizes the order in which the figure number groups are to be produced for the results of the process executed by the grouping unit 38 and the results of the process executed by the second component allocation determining unit 40. Specifically, the production order determining unit 42 optimizes the production order of the figure number groups based on off-line setup time periods of the figure number groups, time periods (production time periods) for mounting components on the boards, off-line setup waiting time periods, and the like. As illustrated in FIG. 9, the production order determining unit 42 may obtain the optimized production order of different types whose number is equal to twice the number (n) of variations used by the first component allocation determining unit 36.

As illustrated in FIG. 9, the production plan determining unit 44 determines, as a production plan, production order that is among the number 2n of types of the production order obtained by the production order determining unit 42 and causes the shortest production time period. The production plan output unit 46 transmits the production plan determined by the production plan determining unit 44 to the worker terminal 60 and the production line 70.

The production plan includes information indicating the figure numbers (boards), the mounters, components, the numbers of components, the order in which the figure numbers are to be produced, time when carriages of the mounters are switched to other carriages, and components to be prepared on (set on) the other carriages. Based on the production plan, time periods for mounting the components on the figure numbers change, time periods (off-line setup time periods) for preparing (setting) the components on the carriages change, off-line setup waiting time periods in the case where off-line setups (preparation of components on carriages) of components to be mounted are not terminated change, and the production time period changes. Thus, the server 10 generates an appropriate production plan so that the production time period is reduced.

Returning to FIG. 1, the worker terminal 60 is a terminal that is held by a worker or placed near the production line 70. The worker terminal 60 may be a personal computer (PC), a tablet terminal, a smartphone, or the like. The worker terminal 60 includes a display and displays the production plan determined by the server 10, thereby supporting an operation by the worker.

(Process of Determining Production Plan by Server 10)

A process of determining the production plan by the server 10 is described in detail using a flowchart of FIG. 10.

The process illustrated in FIG. 10 is executed when a production plan for a new figure number is to be generated or, for example, before a daily operation in the production line 70 is started.

In the process illustrated in FIG. 10, in step S10, the controller 34 acquires the figure number quantity information and the production information from the figure number quantity information DB 52 and the production information DB 54 via the figure number quantity information collector 30 and the production information collector 32. In this case, the controller 34 may acquire the information illustrated in FIGS. 6 to 8. The information acquired by the controller 34 is used in the processes executed by the units 36 to 46.

Then, in step S12, the first component allocation determining unit 36 executes the process of optimizing the component allocation (for each figure number). The process of optimizing the component allocation (for each figure number) is described below in detail.

(Process of Optimizing Component Allocation (for Each Figure Number))

The first component allocation determining unit 36 executes formulation as an integer plan problem for each of variations for which optimization indices and constraints vary. The first component allocation determining unit 36 uses the integer plan problem solver such as the GLPK to execute the process of optimizing the component allocation for each of the figure numbers. The embodiment assumes that four variations are used.

Common constraints imposed regardless of the variations are as follows.

(1) Components other than different types of components able to be set on carriages are not set.

(2) A quantity of different types of components able to be set on a carriage does not exceed the capacity of the carriage.

(3) The total number of components allocated to all the carriages for the types of components is equal to the number of components to be mounted on the figure numbers.

In addition, the four variations to be used in the embodiment are as follows.

(Variation 1) Components of fixed carriages are able to be set on initial setup carriages.

A constraint: the components of the fixed carriages are not set on the initial setup carriages.

An objective function: the maximum value among mounting time periods of the mounters (is minimized).

(Variation 2) The components of the fixed carriages are not able to be set on the initial setup carriages.

A constraint: the components of the fixed carriages are not set on the initial setup carriages.

An objective function: the maximum value among the mounting time periods of the mounters (is minimized).

(Variation 3) Recommended carriages are considered.

Setting: a recommended carriage (referred to as recommended carriage) is set for each type of components.

A constraint: the components of the fixed carriages are not set on the initial setup carriages.

An objective function: the number of types of components set on carriages other than the recommended carriages (is minimized).

(Variation 4) The recommended carriages and the mounting time periods are considered.

Setting: a recommended carriage is set for each type of components.

A constraint: the components of the fixed carriages are not set on the initial setup carriages.

An objective function: a weighted sum of the "number of types of components set on carriages other than the recommended carriages" and the "maximum value among the mounting time periods of the mounters" (is minimized).

In this case, the formulation as the integer plan problem by the first component allocation determining unit 36 is described below.

The first component allocation determining unit 36 sets the following as variables, fixed values, constraints, and objective functions.

(Variables)

(1) $n_{ij}$: the number (number of components to be mounted) of j-th components to be mounted on a figure number from an itch carriage position. In this case, i=1, 2, ..., I, and j=1, 2, ..., J. I is the number of carriage positions, and J is the number of types of components to be mounted.

(2) $b_{ij}$: a binary variable

The binary variable $b_{ij}$ indicates the allocation of a j-th component to an i-th carriage position. When the binary variable $b_{ij}$ is 1, the allocation is executed. When the binary variable $b_{ij}$ is 0, the allocation is not executed. The binary variable $b_{ij}$ is a variable indicating only 0 or 1.

(3) $xd_{ij}$: a binary variable (4) $bd_{ij}$: a binary variable (5) $t_k$: a mounting time period of a mounter k k=1, 2, ..., K. K is the number of mounters.

(6) l: the maximum value (that is used for the variations 1, 2, and 4) among the mounting time periods (7) p: a penalty (that is used for the variations 3 and 4) when the allocation is executed on a carriage other than the recommended carriages.

(Fixed Values)

(1) $I_k$: a set of carriage positions belonging to a mounter k. The set is found from the fields for "mounters" and "carriage positions" in the mounter information table 154B illustrated in FIG. 7B.

(2) $L_i$: a capacity at an i-th carriage position $L_i$ is a value indicated in the field for "capacities of carriages" in the mounter information table 154B illustrated in FIG. 7B.

(3) $W_{ij}$: a capacity to be used when a j-th component is set at an i-th carriage position. $W_{ij}$ is a value indicated in the field for "capacities to be used for components" in the carriage position information table 154C illustrated in FIG. 8.

(4) $T_{ij}$: a time period for mounting a single j-th component from an i-th carriage position. $T_{ij}$ is a value indicated in the field for "time periods for mounting a single component" in the carriage position information table 154C illustrated in FIG. 8.

(5) $M_j$: the number of j-th components to be mounted on a target figure number. $M_j$ is a value indicated in the field for "the numbers of components to be mounted on a single board" in the mounting component information table 154A illustrated in FIG. 7A.

(6) $P_{ij}$: is a penalty when a j-th component is allocated to an i-th carriage position. $P_{ij}$ is a value indicated in the field for "allocation penalties" in the carriage position information table 154C illustrated in FIG. 8 and is used for the variations 3 and 4.

(7) $\Lambda$: a weight of a mounting time period and a penalty ($0 \le \Lambda \le 1$). $\Lambda$ is a fixed value give from an external and is used for the variation 4.

(Constraints (Common Constraints))

Common constraints for the variations 1 to 4 are as follows.

(1) $n_{ij}=0$ for a component j that is not able to be set at a carriage position i. Whether or not the mounting of a component is disabled is recognized based on whether or not "mounting disabled" is stored in the field for "time periods for mounting a single component" in the carriage position information table 154C illustrated in FIG. 8.

(2) Equation (1): a constraint for the number of components j to be mounted

[Equation 1]

$$\forall j \, M_j = \sum_{i=1}^{I} n_{ij} \quad (1)$$

(3) Equation (2): a constraint for a capacity at a carriage position

[Equation 2]

$$\forall i \, L_i \ge \sum_{j=1}^{J} W_{ij} \times b_{ij} \quad (2)$$

(4) Equation (3): a relationship of a mounting time period of a mounter k

[Equation 3]

$$\forall k \, t_k = \sum_{i \in I_k} \sum_{j=1}^{J} T_{ij} \times n_{ij} \quad (3)$$

(5) Equation (4): a relationship between b and n

[Equation 4]

$$\forall i, \forall j \, b_{ij} \le n_{ij}, b_{ij} \ge n_{ij} - U \times (1 - xd_{ij}), b_{ij} \ge 1 - U \times (1 - bd_{ij}), \\ bd_{ij} + xd_{ij} = 1 \quad (4)$$

(Constraints (Constraints for Variations))

(1) Equation (5): a relationship of the maximum value among mounting time periods (that is used for the variations 1, 2, and 4)

$$\forall k \, 1 \ge t_k \quad (5)$$

(2) Equation (6): a penalty (used for the variations 3 and 4)

[Equation 5]

$$p = \sum_{i=1}^{I} \sum_{j=1}^{J} P_{ij} \times b_{ij} \quad (6)$$

(3) $n_{13}=0$ for an initial setup carriage position i for a component j set on a fixed carriage (used for the variation 2)

This is recognized based on whether or not "fixed carriage" is stored in the field for "capacities to be used for components" in the carriage position information table 154C illustrated in FIG. 8.

(Objective Functions)

Objective functions are defined for the variations as follows. The first component allocation determining unit 36 determines values of variables so that the objective functions are minimized.

(1) An objective function for the variations 1 and 2: 1
(2) An objective function for the variation 3: p
(3) An objective function for the variation 4: $1 \times \Lambda + p \times (1 \times \Lambda)$ The first component allocation determining unit 36 solves the aforementioned integer plan problem for each of the figure numbers for the variations, thereby executing the process of optimizing the component allocation (for each figure number).

Returning to FIG. 10, in the next step S14, the grouping unit 38 executes the grouping process. As described above, since the component allocation for each of the figure numbers for each of the variations is determined in step S12, the figure numbers are grouped in accordance with the component allocation in step S14. The grouping of the figure numbers is disclosed in the earlier application (Japanese Patent Application No. 2015-243096) applied for by the present applicant. The earlier application indicates an example in which a single carriage is used. However, since mounters and carriage positions are included in the mounter line according to the embodiment, the figure numbers are grouped only in the case where the earlier application is applied and the grouping is executed on all the initial setup carriages excluding the fixed carriages. As a result of the grouping, figure number groups are generated and the component allocation to the initial setup carriages corresponding to the figure number groups is determined.

Then, in step S16, the second component allocation determining unit 40 executes the process of optimizing the component allocation (for each group). The process of optimizing the component allocation (for each group) is described below in detail.

(Process of Optimizing Component Allocation (for Each Group))

In the process, the component allocation to initial setup carriage positions is redetermined for each of the figure number groups determined in the group process. Specifically, a quantity of components allocated to an initial setup carriage position is smaller than a capacity of a carriage, depending on a figure number group. By allocating a new component to this empty space, the total of time periods for mounting on the figure number group is further reduced.

In this process, the formulation is executed as the integer plan problem, like the process of optimizing the component allocation (for each figure number) in step S12. The process of optimizing the component allocation for each group is executed using the integer plan problem solver such as the GLPK.

Variables, fixed values, constraints, and objective functions used in this process are as follows.

(Variables)

(1) $n_{qij}$: the number of j-th components to be mounted on a figure number q belonging to a target group from an i-th carriage position q=1, 2, ..., Q (Q is the number of figure numbers belonging to the target group).

(2) $b_{ij}$: a binary variable

The binary variable $b_{ij}$ indicates the allocation of a j-th component to an i-th carriage position. When the binary variable $b_{ij}$ is 1, the allocation is executed. When the binary variable $b_{ij}$ is 0, the allocation is not executed. The binary variable is a variable indicating only 0 or 1.

(3) $xd_{ij}$: a binary variable
(4) $bd_{ij}$: a binary variable
(5) $t_{qk}$: a mounting time period of a mounter k
(6) $m_q$: the maximum value among time periods for mounting on a figure number q
(7) $sn_{ij}$: the total number of j-th components to be mounted from an i-th carriage position (Fixed Values)

(1) $N_q$: the number of boards of a figure number q belonging to a target figure number group q=1, 2, ..., Q. $N_q$ may be acquired from the field for the "numbers of boards" in the figure number quantity information DB 52 illustrated in FIG. 6.

(2) $I_k$: a set of carriage positions belonging to a mounter k $I_k$ is found from the fields for "mounters" and "carriage positions" in the mounter information table 154B illustrated in FIG. 7B.

(3) $L_i$: a capacity at an i-th carriage position $L_i$ is a value indicated in the field for "capacities of carriages" in the mounter information table 154B illustrated in FIG. 7B.

(4) $W_{ij}$: a capacity to be used when a j-th component is set at an i-th carriage position $W_{ij}$ is a value indicated in the field for "capacities to be used for components" in the carriage position information table 154C illustrated in FIG. 8.

(5) $T_{ij}$: a time period for mounting a single j-th component from an i-th carriage position $T_{ij}$ is a value indicated in the field for "time periods for mounting a single component" in the carriage position information table 154C illustrated in FIG. 8.

(6) $M_{qj}$: the number of j-th components to be mounted on a figure number q $M_{qj}$ is a value indicated in the field for "the numbers of components to be mounted on a single board" in the mounting component information table 154A illustrated in FIG. 7A.

(Constraints)

(1) For a component j that is not able to be set at a carriage position i $$\forall q\ nq_{ij}=0 \qquad (7)$$

Whether or not a component is not able to be mounted is recognized based on whether or not "mounting disabled" is stored in the field for "time periods for mounting a single component" in the carriage position information table 154C illustrated in FIG. 8.

(2) Equation (8): a constraint for the number of components j to be mounted on a figure number q

[Equation 6]
$$\forall j, \forall q\ M_{qj} = \sum_{i=1}^{I} n_{qij} \qquad (8)$$

(3) Equation (9): a constraint for a capacity at a carriage position

[Equation 7]
$$\forall i\ L_i \geq \sum_{j=1}^{J} W_{ij} \times b_{ij} \qquad (9)$$

(4) Equation (10): a relationship of a mounting time period of a mounter k for a figure number q

[Equation 8]
$$\forall k, \forall q\ qt_{qk} = \sum_{i \in I_k} \sum_{j=1}^{J} T_{ij} \times n_{qij} \qquad (10)$$

(5) Equation (11): a relationship between b and $sn_{ij}$

[Equation 9]
$$\forall i, \forall j\ b_{ij} \leq sn_{ij}, b_{ij} \geq sn_{ij} - U \times (1-xd_{ij}), b_{ij} \geq 1 - U \times (1-bd_{ij}),$$
$$bd_{ij} + xd_{ij} = 1 \qquad (11)$$

(6) Equation (12): a relationship of the maximum value among time periods for mounting on a figure number q $$\forall k, \forall q\ m_q \geq t_{qk} \qquad (12)$$

(7) Equation (13): a relationship of the total number of components to be mounted

[Equation 10]
$$\forall i, \forall j\ jsn_{ij} = \sum_{q=1}^{Q} n_{qij} \qquad (13)$$

(Objective Function)

An objective function is defined as indicated by the following Equation (14). The second component allocation determining unit 40 determines variables so that the objective function (the total of the numbers of boards of figure numbers×the mounting time period) of the following Equation (14) is minimized.

[Equation 11]
$$\sum_{q=1}^{Q} N_q \times m_q \qquad (14)$$

The second component allocation determining unit 40 solves the aforementioned integer plan problem for each of the groups, thereby executing the process of optimizing the component allocation (for each group).

Returning to FIG. 10, in the next step S18, the production order determining unit 42 executes the process of optimizing the production order. The process of optimizing the production order is described below in detail.

(Process of Optimizing Production Order)

As a result of the grouping process or as a result of the process of optimizing the component allocation (for each group), an off-line setup time period and a mounting time period are determined for each of the groups. Thus, the production order determining unit 42 optimizes the production order in which the groups are to be produced, and minimizes the off-line setup waiting time periods and the production time period. In this process, formulation is executed as an integer plan problem, and the process of optimizing the production order is executed using an integer plan problem solver.

Variables, fixed values, constraints, and an objective function used in this process are as follows.

(Variables)

(1) $x_{ij}$: a variable indicating the order of a group

When the order that a group j is produced is the i-th order, $x_{ij}$ is 1. When the order that the group j is to be produced is not the i-th order, $x_{ij}$ is 0. In this case, i=1, 2, ... G, j=1, 2, ... G, and G is the number of groups.

(2) $ds_i$: start time of an off-line setup of the i-th group (3) $de_i$: end time of the off-line setup of the i-th group (4) $ms_i$: start time of mounting on the i-th group (5) $me_i$: end time of the mounting on the i-th group (Fixed Values)

(1) $D_j$: an off-line time period of a group j $D_j$ is the total of off-line setup time periods at carriage positions for the group j and is calculated from the carriage position information table 154C illustrated in FIG. 8 when the groups are determined in the grouping process (S14).

(2) $M_j$: a time period for mounting on the group j $M_j$ is the total of (the numbers of boards of figure numbers×a mounting time period) of the group j.

(Constraints)

(1) Equations (15) and (16): a constraint for which production order is set for each of the groups and different for the groups.

[Equation 12]

$$\forall i \sum_{j=1}^{G} x_{ij} = 1 \quad (15)$$

$$\forall j \sum_{i=1}^{G} x_{ij} = 1 \quad (16)$$

(2) Equation (17): a relationship between end time of an off-line setup for an i-th group and start time of an off-line setup for an i+1-th group $$\forall i \in \{1, \ldots, G-1\} ds_{i+1} = de_i \quad (17)$$

(3) Equation (18): a relationship between start time of an off-line setup for an i-th group and end time of the off-line setup for the i-th group

[Equation 13]

$$\forall i \, de_i = ds_i + \sum_{j=1}^{Q} D_j \times x_{ij} \quad (18)$$

(4) Equation (19): a relationship between end time of an off-line setup for an i-th group and start time of mounting on the i-th group $$\forall i \, ms_i \geq de_i \quad (19)$$

(5) Equation (20): a relationship between end time of mounting on an i-th group and start time of mounting on an i+1-th group $$\forall i \in \{1, \ldots, G-1\} ms_{i+1} \geq me_i \quad (20)$$

(6) Equation (21): a relationship between start time of mounting on an i-th group and end time of the mounting on the i-th group

[Equation 14]

$$\forall i \, me_i = ms_i + \sum_{j=1}^{Q} M_j \times x_{ij} \quad (21)$$

(7) Equation (22): start time of mounting on the first group is time 0.

$$Ds_i = 0$$

(Objective Function)

The objective function is end time $me_G$ of mounting on a G-th group (the last group), and the production order determining unit 42 determines the variables so that the objective function is minimized. Minimizing $me_G$ is equivalent with the minimization of an off-time setup waiting time period. The production time period is the total of off-line setup time periods and the total of mounting time periods, and the mounting time periods are already determined before the execution of step S18.

Returning to FIG. 10, in the next step S20, the production plan determining unit 44 executes the process of determining the production plan. In the processes up to this step, the number of the results of the process of optimizing the production order is (n×2) (since n=4 in the embodiment, 4×2=8), as illustrated in FIG. 9. The production plan determining unit 44 determines, as the production plan, a result that is among the 8 results of the process of optimizing the production order and causes the shortest production time period.

Then, the process of determining the production plan by the server 10 is terminated. The production plan output unit 46 transmits the production plan determined by the production plan determining unit 44 to the production line 70 and the worker terminal 60. The production plan information is, for example, information illustrated in FIG. 11. The production plan information illustrated in FIG. 11 includes figure number group production order information, figure number group information, and component allocation information. The figure number group production order information is information indicating figure number groups to be produced and the order that the figure number groups are to be produced. The figure number group information is information indicating which figure numbers are included in the figure number groups. In addition, the component allocation information is information indicating the figure numbers, carriage positions, components, and the numbers of components to be mounted on the figure numbers from the carriage positions. The production time period may be reduced by executing the production in the production line 70 based on the production plan.

Figure 12:
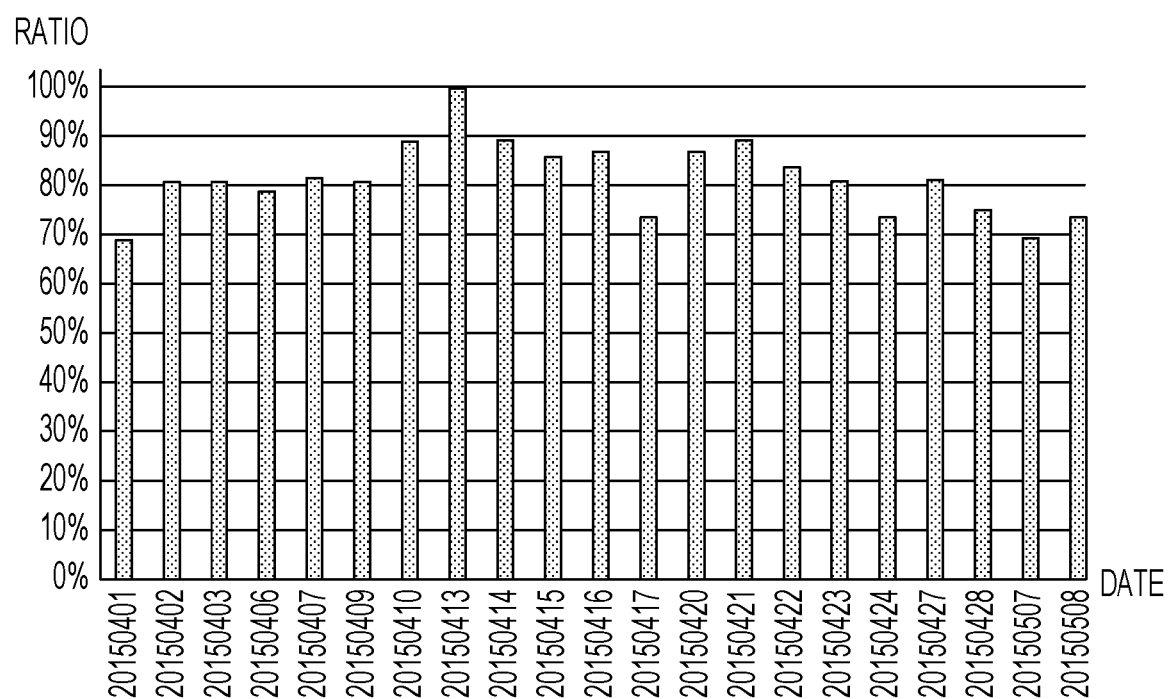
FIG. 12 is a diagram describing an effect of the embodiment.

FIG. 12 illustrates a graph of the ratios of production time periods in the case where production plans are generated in accordance with the method according to the embodiment to production time periods in the case where production plans are generated in accordance with a known method based on actual figure number quantity information. In the known method, component allocation is determined so that the maximum value among component mounting time periods of mounters included in a mounter line is minimized, and a method described in the aforementioned Patent Literature 4 is used after the determination of the component allocation. As illustrated in FIG. 12, when the method according to the embodiment is used, the production time periods may be reduced to an average of 80%, compared with the case where the known method is used.

Most of the production time period is determined based on an off-line setup time period of each of the groups and a time period for mounting on each of the groups. Whether the total of the off-line setup time periods or the total of the mounting time periods is longer than the other is determined based on given figure numbers and the numbers of boards of the given figure numbers. However, off-line setups of the figure number groups and the component mounting are independently executed (in parallel). Thus, when the difference between the total of the off-line setup time periods and the total of the mounting time periods is large, most of the production time period depends on the longer one of the total of the off-line setup time periods and the total of the mounting time periods. In addition, the mounting time periods and the off-line setup time periods have a trade-off relationship. Thus, in the case where the total of the off-line setup time periods is longer than the total of the mounting time periods, even when the mounting time periods are slightly increased, it is more effective to reduce the off-line setup time periods in order to reduce the production time period In the case where the total of the off-line setup time periods is long, even when the mounting time periods are increased by certain time periods, the figure numbers are easily grouped, and the variations 2 to 4 that may reduce the off-line setup time periods are effective. On the other hand, in the case where the total of the mounting time periods is long, even when the off-line setup time periods are increased by certain time periods, the mounting time periods may be reduced by setting the same components on mounters to reduce the maximum value among the mounting time periods of the mounters. A pattern in which the variation 1 and the process of optimizing the component allocation (for each group) are applied is effective.

In the embodiment, in a case other than the aforementioned case, for example, even when the difference between the total of the off-line setup time periods and the total of the mounting time periods is small, the process of optimizing the production order is executed on all figure groups that have been obtained in the variations 1 to 4 and on which the process of step S16 has been executed, or the process of optimizing the production order is executed on all figure groups that have been obtained in the variations 1 to 4 and on which the process of step S16 has not been executed, and an appropriate production plan that causes the shortest production time period is selected.

The production order, the component allocation, and off-line setup time periods and mounting time periods of the figure number groups determined based on combinations of the groups have independent characteristics (even when the production order is changed, the off-line setup time periods of the figure number groups and the time periods for the mounting on the figure number groups do not change). Thus, in the process of optimizing the production order, the problem may be solved as an independent combinatorial optimization problem under the condition in which the figure number groups are not changed. Thus, in the embodiment, the production order is optimized after the determination of the component allocation and combinations of the figure number groups. In addition, since the number of variables to be used in the process of optimizing the production order is nearly equal to the square of the number of figure number groups, the number of variables to be used in the process of optimizing the production order is a value that causes the optimal solution.

As described above in detail, according to the embodiment, the first component allocation determining unit 36 uses variations to formulate, as the integer plan problem, the component allocation indicating, for each of the figure groups, any of the mounters, components, and the number of components to be mounted on a board from the mounter, and optimizes the component allocation using the integer plan problem solver. In addition, the grouping unit 38 executes, for each of the variations, the process of grouping the figure numbers to be produced without switching carriages set for mounters. In addition, the production order determining unit 42 formulates, as the integer plan problem, the production order of the figure number groups after the grouping, solves the integer plan problem using the integer plan problem solver, and executes, for each of the variations, the process of optimizing the production order so that the time period for producing all the products is minimized. Then, the production plan determining unit 44 determines, as the production plan for the production line 70, a production plan that causes the shortest (smallest) production time period. As described above, in the embodiment, since the optimization problem of the production plan of the production line 70 is solved by dividing the optimization problem into the partial optimization problems from which solutions are calculated within realistic time periods, combination explosion does not occur. Thus, a production plan that is close to the optimal production plan and able to be executed may be determined within a realistic time period.

In addition, in the embodiment, the second component allocation determining unit 40 reoptimizes the component allocation so that a time period for the mounting on the groups is minimized after the grouping of the figure numbers by the grouping unit 38. Then, the production order determining unit 42 executes the process of optimizing the production order of the figure number groups after the grouping for both of the reoptimized component allocation and the component allocation that has not been reoptimized. Thus, after a large number of candidate production plans are calculated, an appropriate production plan that causes the shortest production time period among the candidate production plans is determined.

In the aforementioned embodiment, the processes by the second component allocation determining unit 40 may be omitted. In addition, in the aforementioned embodiment, the production line 70 may include surface mounting lines 20.

Figure 13:
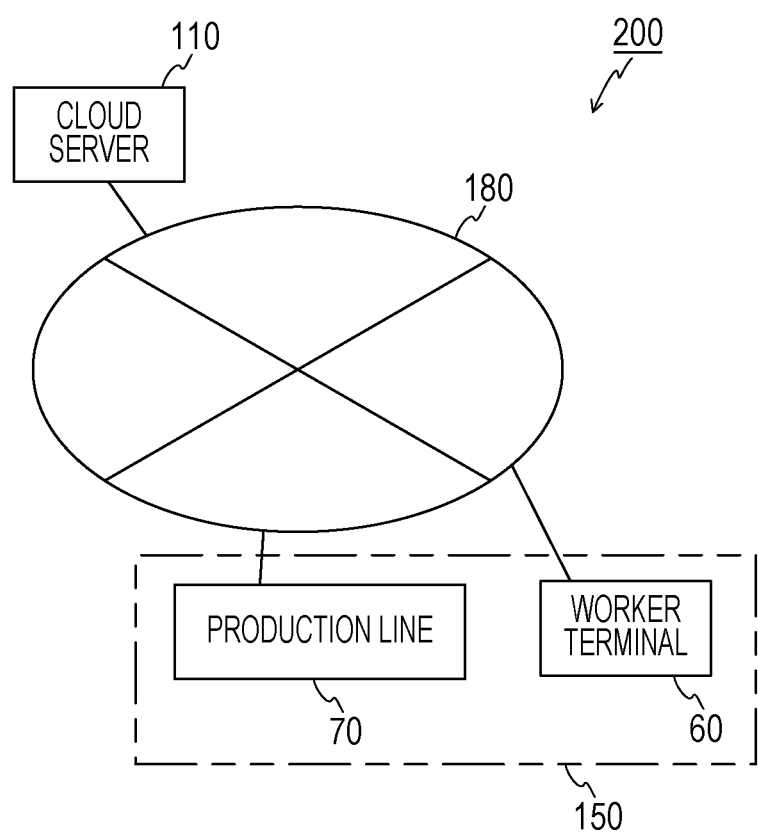
FIG. 13 is a diagram illustrating a modified example.

The server 10 may be an on-premises server managed by a company owning the production line 70 or the like, similarly to the aforementioned embodiment (FIG. 1), or may be a cloud server, similarly to a production system 200 illustrated in FIG. 13. A cloud server 110 illustrated in FIG. 13 acquires and processes data transmitted from the worker terminal 60 within a factory 150 via a network 180, and provides results of processing the data to the worker terminal 60. A country in which the cloud server 110 exists may be different from a country in which the factory 150 exists.

The aforementioned processing functions may be enabled by a computer. In this case, a program in which details of the processes to be executed by the functions included in a processing device are described is provided. The computer executes the program, thereby enabling the aforementioned processing functions in the computer. The program in which the details of the processes are described may be recorded in a recording medium (excluding a carrier wave) readable by the computer.

In the case where the program is distributed, a portable recording medium storing the program is marketed and is, for example, a digital versatile disc (DVD), a compact disc read only memory (CD-ROM), or the like. In addition, the program may be stored in a storage device of a server computer and transferred from the server computer to another computer.

The computer configured to execute the program stores, in a storage device of the computer, the program recorded in the portable recording medium or transferred from the server computer. The computer reads the program from the storage device of the computer and executes the processes in accordance with the program. The computer may read the program directly from the portable recording medium and execute the processes in accordance with the program. In addition, every time the computer receives the program transferred from the server computer, the computer may sequentially execute the processes in accordance with the received program.

The aforementioned embodiment is a preferred embodiment of the invention. The embodiment, however, is not limited to this and may be variously modified within departing from the gist of the invention. All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A production-plan generating device for generating a production plan for a surface mounting line including a plurality of mounters for mounting surface mounting components on printing boards to produce products, the production-plan generating device comprising:
    a processor configured to:
        formulate, as an integer plan problem for each of variations for which optimization indices and constraints vary, component allocation indicating, for each of types of the products, any of the mounters, surface mounting components, and the number of surface mounting components to be mounted on a printing board from the mounter, and optimize the component allocation using an integer plan problem solver;
        use results of the optimization of the component allocation to execute, for each of the variations, a process of grouping the types of products to be produced without switching surface mounting component supply carriages set for the plurality of mounters;
        formulate, as an integer plan problem, an order of the production of groups of the products after the grouping, solve the integer plan problem using integer plan problem solver, and execute, for each of the variations, a process of optimizing the production order so that a time period for producing all the products is minimized;
        determine, as the production plan for the surface mounting line, a production plan that is among results of the process of optimizing the production order and causes the shortest production time period; and
        implement the determined production plan to the service mounting line to produce the products.

2. The production-plan generating device according to claim 1, further comprising
    execute, for each of the variations, a process of reoptimizing the component allocation so that a time period for mounting the surface mounting components on the types of printing boards included in the groups after the grouping is minimized,
    wherein the processor is configured to execute a process of optimizing the production order of the groups of the products after the grouping based on results of the process of reoptimizing and execute a process of optimizing the production order of the groups of the products after the grouping based on results of the optimizing the production order of the groups.

3. A production-plan generation method for generating a production plan for a surface mounting line including a plurality of mounters for mounting surface mounting components on printing boards to produce products, and causing a computer to execute a process, the process comprising:
    formulating, as an integer plan problem for each of variations for which optimization indices and constraints vary, component allocation indicating, for each of types of the products, any of the mounters, surface mounting components, and the number of surface mounting components to be mounted on a printing board from the mounter, and optimizing the component allocation using an integer plan problem solver;
    using results of the optimization of the component allocation to execute, for each of the variations, a process of grouping the types of products to be produced without switching surface mounting component supply carriages set for the plurality of mounters;
    formulating, as an integer plan problem, an order of the production of groups of the products after the grouping, solve the integer plan problem using integer plan problem solver, and execute, for each of the variations, a process of optimizing the production order so that a time period for producing all the products is minimized;
    determining, as the production plan for the surface mounting line, a production plan that is among results of the process of optimizing the production order and causes the shortest production time period; and
    implementing the determined production plan to the service mounting line to produce the products.

4. The production-plan generation method according to claim 3, the process further comprising
    executing, for each of the variations, a process of reoptimizing the component allocation so that a time period for mounting the surface mounting components on the types of printing boards included in the groups after the grouping is minimized, wherein in the process of optimizing the production order, a process of optimizing the production order of the groups of the products after the grouping based on results of the process of reoptimizing the component allocation, and a process of optimizing the production order of the groups of the products after the grouping based on results of the optimizing the production order of the groups.

5. A non-transitory computer-readable recording medium storing therein a production-plan generation program for generating a production plan for a surface mounting line including a plurality of mounters for mounting surface mounting components on printing boards, and causing a computer to execute a process, the process comprising:

formulating, as an integer plan problem for each of variations for which optimization indices and constraints vary, component allocation indicating, for each of types of the products, any of the mounters, surface mounting components, and the number of surface mounting components to be mounted on a printing board from the mounter, and optimizing the component allocation using an integer plan problem solver;

using results of the optimization of the component allocation to execute, for each of the variations, a process of grouping the types of products to be produced without switching surface mounting component supply carriages set for the plurality of mounters;

formulating, as an integer plan problem, an order of the production of groups of the products after the grouping, solve the integer plan problem using integer plan problem solver, and execute, for each of the variations, a process of optimizing the production order so that a time period for producing all the products is minimized;

determining, as the production plan for the surface mounting line, a production plan that is among results of the process of optimizing the production order and causes the shortest production time period; and implementing the determined production plan to the service mounting line to produce the products.

* * * * *